(12) United States Patent
Kodama (10) Patent No.: US 8,923,082 B2
(45) Date of Patent: Dec. 30, 2014

(54) SEMICONDUCTOR DEVICE ON WHICH WAFER-LEVEL BURN-IN TEST IS PERFORMED AND MANUFACTURING METHOD THEREOF

(75) Inventor: Takuyo Kodama, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 282 days.

(21) Appl. No.: 13/483,439

(22) Filed: May 30, 2012

(65) Prior Publication Data

US 2012/0307581 A1 Dec. 6, 2012

(30) Foreign Application Priority Data

May 31, 2011 (JP) .................................. 2011-122582

(51) Int. Cl.
| | |
|---|---|
| G11C 7/00 | (2006.01) |
| G11C 29/00 | (2006.01) |
| G11C 11/4076 | (2006.01) |
| G11C 29/12 | (2006.01) |
| G11C 7/22 | (2006.01) |
| G11C 29/06 | (2006.01) |

(52) U.S. Cl.
CPC .......... *G11C 11/4076* (2013.01); *G11C 29/006* (2013.01); *G11C 31/31727* (2013.01); *G11C 29/12015* (2013.01); *G11C 7/222* (2013.01); *G11C 29/06* (2013.01)

USPC ............................. 365/201; 365/194; 365/222

(58) Field of Classification Search
CPC ....... G11C 29/50; G11C 11/401; G11C 29/02
USPC .......................................... 365/201, 194, 222
See application file for complete search history.

(56) References Cited

U.S. PATENT DOCUMENTS

| | | | |
|---|---|---|---|
| 5,452,253 A * | 9/1995 | Choi ............................. | 365/201 |
| 6,014,336 A * | 1/2000 | Powell et al. ................. | 365/201 |
| 6,404,250 B1 * | 6/2002 | Volrath et al. ................. | 327/160 |
| 6,437,590 B1 | 8/2002 | Tatsumi | |
| 7,366,965 B2 * | 4/2008 | Yamasaki et al. ............. | 714/718 |

FOREIGN PATENT DOCUMENTS

JP  2001-250398  9/2001

* cited by examiner

*Primary Examiner* — Son Dinh
(74) *Attorney, Agent, or Firm* — Young & Thompson (57) ABSTRACT

Disclosed herein is a device that includes a clock generation circuit that generates an internal clock signal during a normal operation and stops generation of the internal clock signal during a wafer-level burn-in test, a clock tree line that transmits the internal clock signal, and a selector that supplies a dummy clock signal, which is different from the internal clock signal, to the clock tree line during the wafer-level burn-in test.

19 Claims, 6 Drawing Sheets

| WLBI | BA2 | BA1 | | STATE |
|---|---|---|---|---|
| L | – | – | NON-WLBI MODE | – |
| H | L | CLK OPERATION | WLBI MODE | SETTING OF TEST MODE |
| H | H | L | | MODE OUTPUT PROHIBITED |
| H | H | H | | MODE OUTPUT PERMITTED |

SEMICONDUCTOR DEVICE ON WHICH WAFER-LEVEL BURN-IN TEST IS PERFORMED AND MANUFACTURING METHOD THEREOF

BACKGROUND OF THE INVENTION

1. Field of the Invention

The present invention relates to a semiconductor device and manufacturing method thereof, and particularly relates to a semiconductor device on which a wafer-level burn-in test is performed and manufacturing method thereof.

2. Description of Related Art

On a semiconductor device represented by a DRAM (Dynamic Random Access Memory), an acceleration test referred to as "burn-in test" is generally performed before shipment. In the burn-in test, a stress such as a high voltage is applied on a semiconductor device for exposing initial defects. While a normal burn-in test is performed in a state of a chip cut out of a silicon wafer, in recent years, the burn-in test is also performed in a state of a silicon wafer. Such a burn-in test is referred to as "wafer-level burn-in test" (see Japanese Patent Application Laid-open No. 2001-250398).

Because the wafer-level burn-in test is performed in parallel on a large number of semiconductor devices on a wafer, external terminals to be used are considerably limited. Specifically, a command terminal and a clock terminal used in a normal operation are not used, and only some of address terminals and test terminals are connected to a tester. Accordingly, during the wafer-level burn-in test, an external clock signal is not supplied to each of the semiconductor devices either.

However, when an external clock signal is not supplied to a semiconductor device, an operation of a circuit that generates an internal clock signal (for example, a DLL circuit) is also stopped, and thus the logic level of a clock tree line that transmits the internal clock signal is fixed. Because the clock tree line is configured by cascade-connecting a large number of CMOS inverter circuits to each other, when the logic level is fixed, a phenomenon referred to as "NBTI (Negative Bias Temperature Instability) degradation" occurs in a P-channel MOS transistor that constitutes a CMOS inverter circuit. The NBTI degradation is a phenomenon in which a threshold voltage is increased when the P-channel MOS transistor is kept to be turned on for a long time. Accordingly, when the NBTI degradation occurs in the clock tree line, the duty of the internal clock signal is changed. The present inventor has found out that the NBTI degradation occurs also during a wafer-level burn-in test.

SUMMARY

In one embodiment, there is provided a semiconductor device that includes: a clock generation circuit that generates an internal clock signal during a normal operation, and stops generation of the internal clock signal during a wafer-level burn-in test; a clock tree line that transmits the internal clock signal; and a selector that supplies a dummy clock signal, which is different from the internal clock signal, to the clock tree line during the wafer-level burn-in test.

In another embodiment, there is provided a semiconductor device that includes: a clock terminal that receives an external clock signal from outside; a delay line that generates an internal clock signal by delaying the external clock signal; a clock tree line that transmits the internal clock signal; a data output circuit that outputs data to outside in synchronization with the internal clock signal having passed through the clock tree line; and a selector that supplies a dummy clock signal to the clock tree line when the external clock signal is stopped.

In another embodiment, there is provided a manufacturing method of a semiconductor device, the method that includes: preparing a semiconductor wafer having a plurality of semiconductor devices each including a clock tree line formed thereon; performing a burn-in test on the semiconductor devices in a wafer state; and supplying a dummy clock signal to the clock tree lines during the burn-in test.

BRIEF DESCRIPTION OF THE DRAWINGS

FIG. 3 is a circuit diagram indicative of an embodiment of a data output circuit 15a;

DETAILED DESCRIPTION OF THE EMBODIMENTS

Preferred embodiments of the present invention will be explained below in detail with reference to the accompanying drawings.

Figure 1:
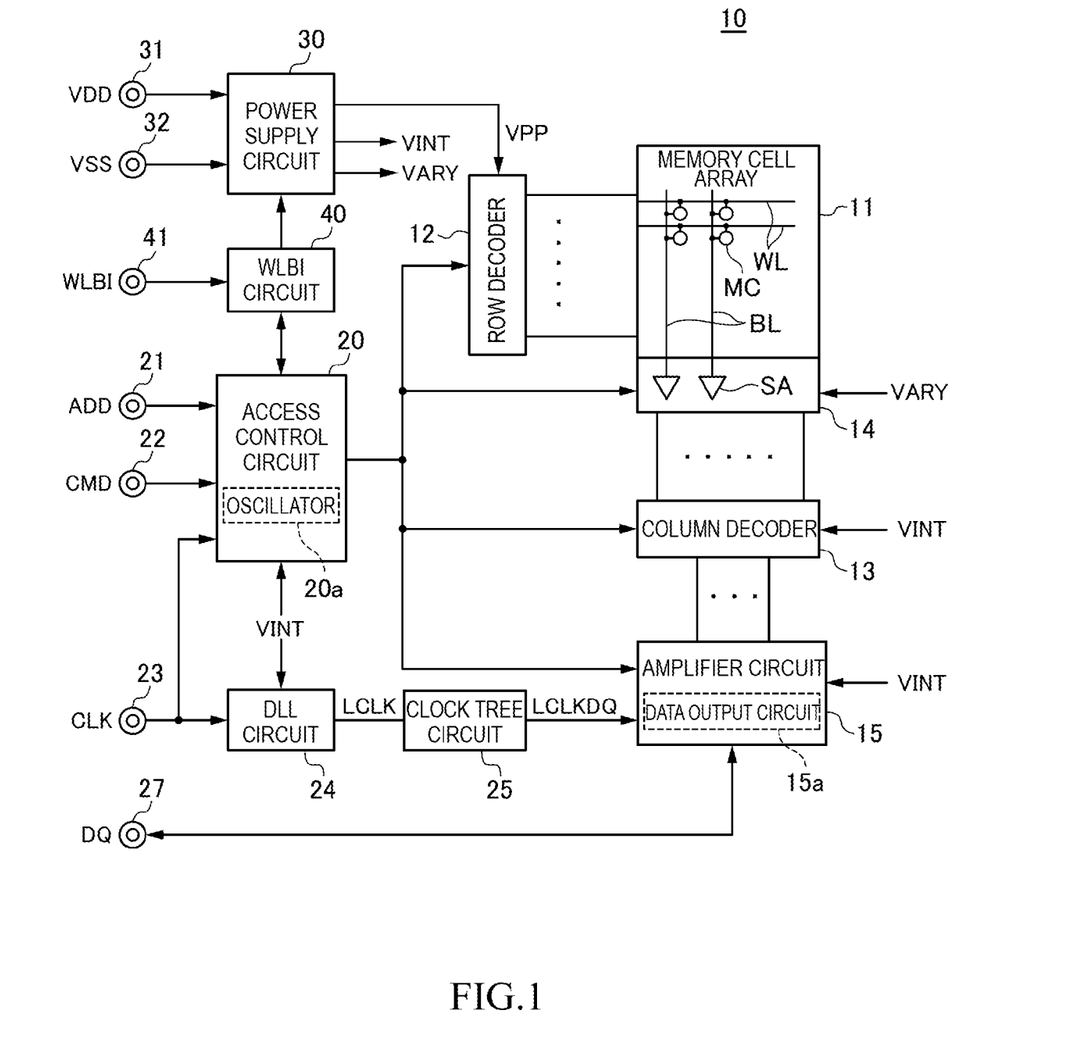
FIG. 1 is a block diagram indicative of an embodiment of a semiconductor device 10 according to the present invention.

Referring now to FIG. 1, the semiconductor device 10 according to the present embodiment is a DRAM, and includes a memory cell array 11. The memory cell array 11 is provided with a plurality of word lines WL and a plurality of bit lines BL crossing with each other, and a memory cell MS is arranged at each intersection therebetween. The word line WL is selected by a row decoder 12 and the bit line BL is selected by a column decoder 13. The bit line BL is connected to a corresponding sense amplifier SA in a sense circuit 14. The bit line BL selected by the column decoder 13 is connected to an amplifier circuit 15 via the sense amplifier SA.

Operations of the row decoder 12, the column decoder 13, the sense circuit 14, and the amplifier circuit 15 are controlled by an access control circuit 20. The access control circuit 20 receives an address signal ADD, a command signal CMD and an external clock signal CLK via an address terminal 21, a command terminal 22 and a clock terminal 23, respectively. The access control circuit 20 receives the address signal ADD, the command signal CMD and the external clock signal CLK, and controls the operations of the row decoder 12, the column decoder 13, the sense circuit 14 and the amplifier circuit 15 based on the signals. The address signal ADD comprises a bank address (BA).

Specifically, when the command signal CMD indicates an active operation of the semiconductor device 10, the address signal ADD is supplied to the row decoder 12. In response to this, the row decoder 12 selects a word line WL indicated by the address signal ADD and thus a corresponding memory cell MC is connected to a bit line BL. And then the access control circuit 20 activates the sense circuit 14.

On the other hand, when the command signal CMD indicates a read operation or write operation of the semiconductor device 10, the address signal ADD is supplied to the column decoder 13. In response to this, the column decoder 13 connects a bit line BL indicated by the address signal ADD to the amplifier circuit 15. Thereby, in the read operation, read data DQ read from the memory cell array 11 via the sense amplifier SA is output via the amplifier circuit 15 from a data terminal 27 to the outside. Outputting of the read data DQ is performed by a data output circuit 15a included in the amplifier circuit 15, the output timing of the read data DQ is controlled by a DLL circuit 24. In the write operation, read data DQ externally supplied via the data terminal 27 is written in a memory cell MC via the amplifier circuit 15 and the sense amplifier SA.

When the command signal CMD indicates entry to a self-refresh mode, an oscillator 20a included in the access control circuit 20 is activated. The oscillator 20a automatically performs a periodic refresh operation on the memory cell array 11.

The DLL circuit 24 receives the external clock signal CLK to generate a phase-controlled internal clock signal LCLK. The external clock signal CLK is supplied to the access control circuit 20 to control the operation timing of the access control circuit 20.

Each circuit block uses a respective predetermined internal voltage as operational power supply. These internal power supplies are generated by a power supply circuit 30 shown in FIG. 1. The power supply circuit 30 receives an external potential VDD and a ground potential VSS supplied via power supply terminals 31 and 32, respectively, and thereby generates internal voltages VPP, VINT, VARY and the like based on the potentials. As an example, $$VPP > VDD > VINT \approx VARY$$

is obtained. The internal voltage VPP is generated by boosting the external potential VDD. The internal voltages VINT and VARY are generated by depressing the external potential VDD.

The internal power supply potential VPP is mainly used in the row decoder 12. The row decoder 12 drives the word line WL selected based on the address signal ADD to the VPP level, thereby turning on a cell transistor included in the memory cell MC. The internal power supply potential VARY is used in the sense circuit 14. When the sense circuit 14 is activated, one of a pair of bit lines BL is driven to the VARY level and the other is driven to the VSS level, thereby amplifying the read data. The internal power supply potential VINT is used as an operational voltage of most of peripheral circuits such as the access control circuit 20. The internal power supply potential VINT which is lower in voltage than VDD is used as the operational voltage of the peripheral circuits, thereby achieving low power consumption.

Furthermore, the semiconductor device 10 according to the present embodiment is provided with a wafer-level burn-in test circuit 40. The wafer-level burn-in test circuit 40 is represented as "WLBI circuit" in FIG. 1. The wafer-level burn-in test circuit 40 is activated based on a wafer-level burn-in test signal WLBI externally input via a test terminal 41. When the wafer-level burn-in test circuit 40 is activated, the wafer-level burn-in test circuit 40 controls the power supply circuit 30 and the like based on an entered operation mode so as to apply a stress on the semiconductor device 10.

A wafer-level burn-in test is performed literally on the semiconductor device 10 in a wafer state. Because the wafer-level burn-in test is performed in parallel on a large number of semiconductor devices on a wafer, external terminals to be used are considerably limited. According to the present embodiment, external terminals used in the wafer-level burn-in test are, in addition to the power supply terminals 31 and 32, some of the address terminals 21, some of the data terminals 27, and the test terminal 41. The command terminal 22, the clock terminal 23 and the like are not used in the wafer-level burn-in test. Accordingly, during the wafer-level burn-in test, operations of the DLL circuit 24 are naturally stopped.

The internal clock signal LCLK that is an output of the DLL circuit 24 is supplied via a clock tree line 25 to the data output circuit 15a. Accordingly, the data output circuit 15a operates in synchronization with an internal clock signal LCLKDQ having passed through the clock tree line 25. The clock tree line 25 is configured by cascade-connecting a large number of CMOS inverter circuits.

As described above, operations of the DLL circuit 24 are stopped during the wafer-level burn-in test. Accordingly, during the wafer-level burn-in test, a clocking signal is not transmitted to the clock tree line 25. Furthermore, because a high voltage is applied during the wafer-level burn-in test, NBTI degradation easily occurs in a P-channel MOS transistor. A configuration for preventing NBTI degradation of the clock tree line 25 during the wafer-level burn-in test is explained below in detail.

Figure 2:
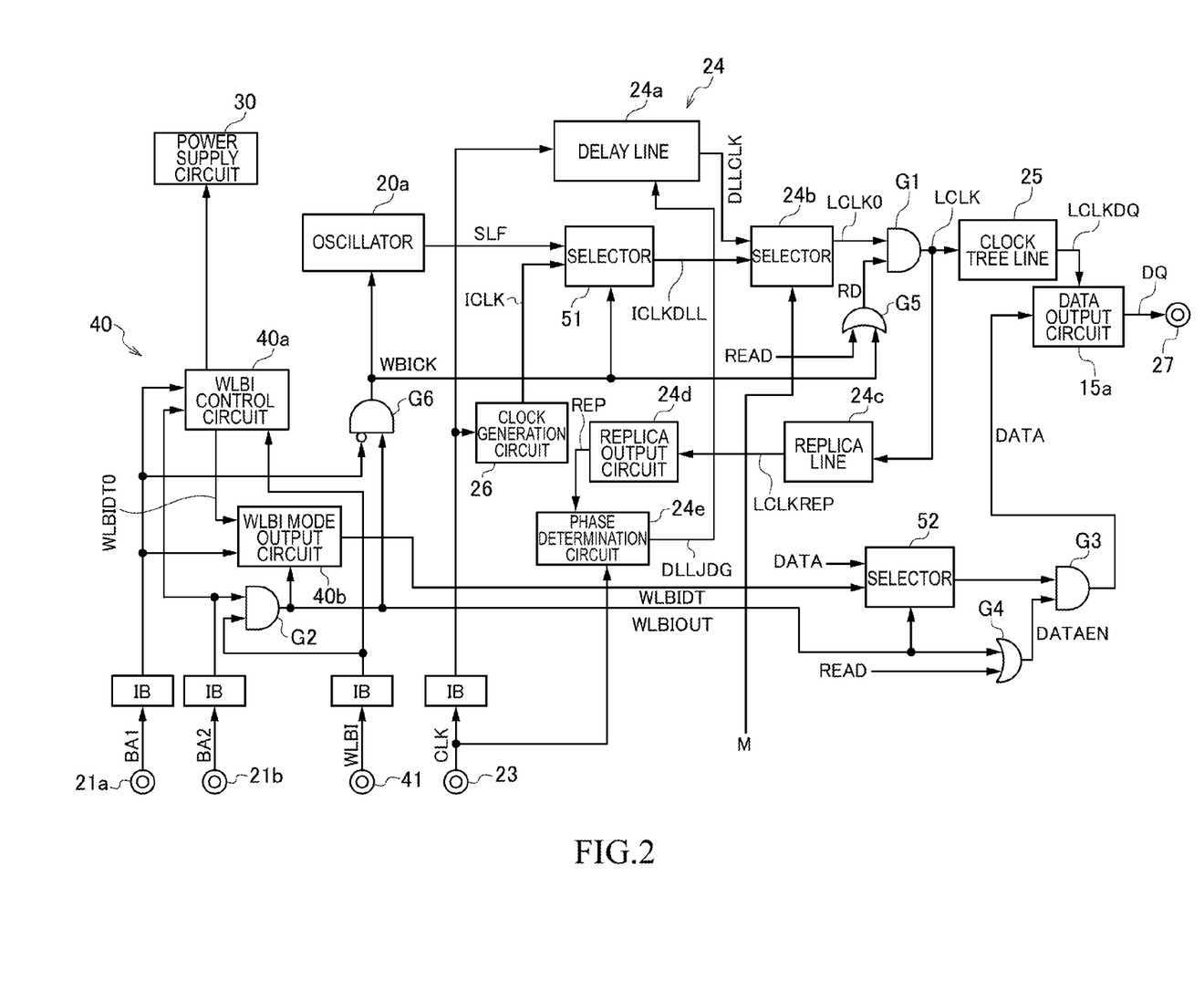
FIG. 2 is a block diagram indicative of an embodiment of a configuration of a main part of the semiconductor device 10 according to the present embodiment.

Turning to FIG. 2, it mainly shows a configuration of the DLL circuit 24 and the wafer-level burn-in test circuit 40 in detail.

FIG. 2 shows external terminals relevant to the DLL circuit 24 and the wafer-level burn-in test circuit 40. Specifically, an address terminal 21a to which a bank address BA1 is input, an address terminal 21b to which a bank address BA2 is input, the clock terminal 23 to which the external clock signal CLK is input, and the test terminal 41 to which a wafer-level burn-in test signal WLBI is input are shown in FIG. 2. Signals input to these external terminals are supplied via corresponding input initial-stage circuits IB to internal circuits. According to the present invention, not only a signal directly input to an external terminal but also a signal having passed through an input initial-stage circuit IB is sometimes considered to be the same as an external signal. Accordingly, a clock signal having passed through the input initial-stage circuit IB is also referred to as "external clock signal CLK".

As shown in FIG. 2, the DLL circuit 24 includes a delay line 24a, a selector 24b, a replica line 24c, a replica output circuit 24d, and a phase determination circuit 24e. The delay line 24a is a clock generation circuit that receives the external clock signal CLK and delays it to generate a phase-controlled internal clock signal DLLCLK. The internal clock signal DLLCLK is supplied to one input node of the selector 24b. An internal clock signal ICLKDLL is supplied to the other input node of the selector 24b. The selector 24b is a circuit that selects one of the internal clock signal DLLCLK and the internal clock signal ICLKDLL based on a mode signal M, and the selected signal is output as an internal clock signal LCLK0. The mode signal M is a signal that indicates whether the DLL circuit 24 is used, and the internal clock signal DLLCLK is selected in a synchronous mode that the DLL circuit 24 is used and the internal clock signal ICLKDLL is selected in an asynchronous mode that the DLL circuit 24 is not used. Because it naturally becomes the asynchronous mode during the wafer-level burn-in test, the selector 24b selects the internal clock signal ICLKDLL.

The internal clock signal LCLK0 output from the selector 24b is supplied to one input node of an AND gate circuit G1. A read signal RD is supplied to the other input node of the AND gate circuit G1. Accordingly, the internal clock signal LCLK0 passes through the AND gate circuit G1 in a time period during which the read signal RD is at a high level, and then output as the internal clock signal LCLK. The read signal RD is a signal activated to a high level at least during a reading operation.

As also shown in FIG. 1, the internal clock signal LCLK is input to the clock tree line 25, and the internal clock signal LCLKDQ having passed through the clock tree line 25 is supplied to the data output circuit 15a. With this configuration, the data output circuit 15a operates in synchronization with the internal clock signal LCLKDQ.

Figure 3:
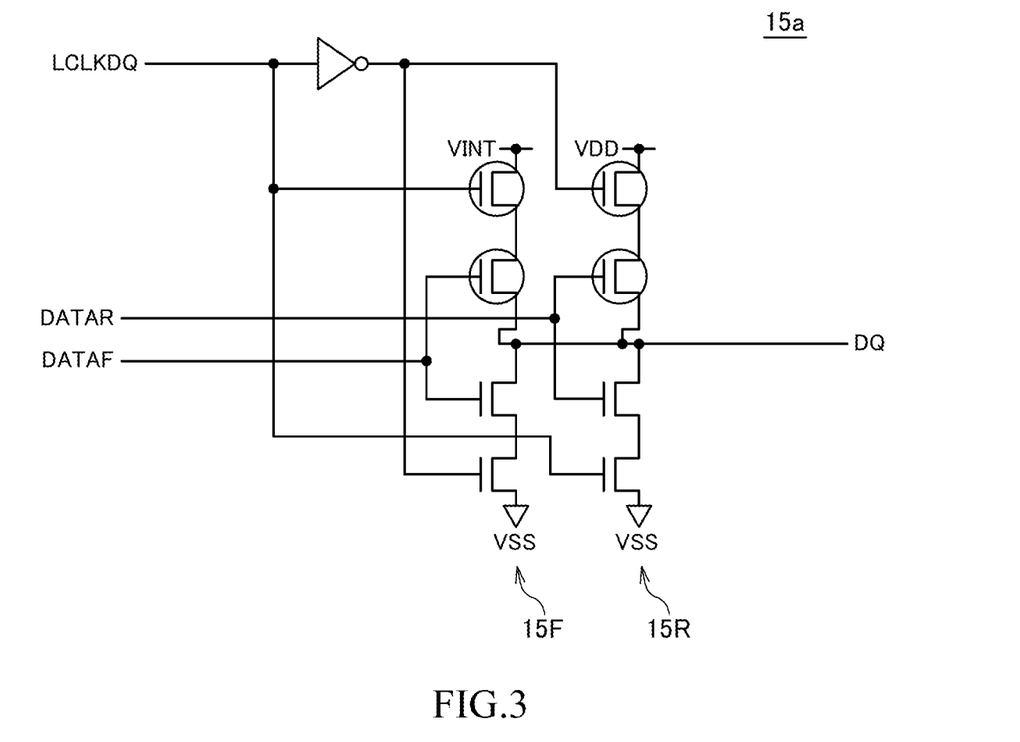

Turning to FIG. 3, the data output circuit 15a includes two clocked inverters 15R and 15F. The clocked inverter 15R is an inverter circuit activated when the internal clock signal LCLKDQ is at a high level. Internal read data DATAR is supplied to an input node and the read data DQ is output from an output node. On the other hand, the clocked inverter 15F is an inverter circuit activated when the internal clock signal LCLKDQ is at a low level. Internal read data DATAF is supplied to an input node and the read data DQ is output from an output node. That is, output nodes of the clocked inverters 15R and 15F are wired-OR connected to the data terminal 27.

The internal read data DATAR is data supposed to be output in synchronization with a rising edge of the internal clock signal LCLKDQ. On the other hand, the internal read data DATAF is data supposed to be output in synchronization with a falling edge of the internal clock signal LCLKDQ. Accordingly, during a normal operation, the internal read data DATAR and DATAF are output alternately in synchronization with clocking of the internal clock signal LCLKDQ. Meanwhile, during a wafer-level burn-in test, the internal read data DATAR and DATAF have the same logic level. Note that the internal read data DATAR and DATAF are represented collectively as DATA in FIG. 2.

Referring back to FIG. 2, the internal clock signal LCLK output from the AND gate circuit G1 is also supplied to the replica line 24c. The replica line 24c is a line replicated the clock tree line 25 and functions to precisely reproduce a delay generated in the clock tree line 25. Accordingly, an edge of an internal clock signal LCLKREP having passed through the replica line 24c precisely coincides with an edge of the internal clock signal LCLKDQ having passed through the clock tree line 25.

The internal clock signal LCLKREP is supplied to the replica output circuit 24d. The replica output circuit 24d is a circuit replicated the data output circuit 15a and functions to precisely reproduce a delay generated in the data output circuit 15a. Accordingly, an edge of a replica signal REP output from the replica output circuit 24d precisely coincides with an edge of the read data DQ output from the data output circuit 15a.

In a DRAM, the edge of the read data DQ needs to coincide precisely with an edge of the external clock signal CLK. When these edges are shifted from each other, the direction of the shifting is detected by the phase determination circuit 24e. That is, the phase determination circuit 24e compares a phase of the replica signal REP to a phase of the external clock signal CLK for indirectly comparing a phase of the read data DQ to a phase of the external clock signal CLK, thereby determining which phase is advanced (or which phase is delayed). As a result of the determination, when the phase of the replica signal REP is advanced with respect to the phase of the external clock signal CLK, a delay amount of the delay line 24a is increased and thus the phase of the internal clock signal DLLCLK is delayed. On the other hand, when it is determined that the phase of the replica signal REP is delayed with respect to the phase of the external clock signal CLK, the delay amount of the delay line 24a is reduced and thus the phase of the internal clock signal DLLCLK is advanced. The delay line 24a is controlled by a determination signal DLL-JDG output from the phase determination circuit 24e. By repeating these operations, the phase of the read data DQ can precisely coincide with the phase of the external clock signal CLK.

The circuit configuration and operations of the DLL circuit 24 are as explained above. When an asynchronous mode that the DLL circuit 24 is not used is selected by the mode signal M, the internal clock signal ICLKDLL that is not phase-controlled is selected instead of the internal clock signal DLLCLK that is an output of the delay line 24a. The internal clock signal ICLKDLL is a signal output from a selector 51, and an internal clock signal ICLK that is an output of a clock generation circuit 26 and supplied to one input node of the selector 51 is selected during a normal operation. The clock generation circuit 26 is a circuit that generates the internal clock signal ICLK based on the external clock signal CLK. A self-refresh timing signal SLF output from the oscillator 20a is supplied to the other input node of the selector 51. When the oscillator 20a is activated, the self-refresh timing signal SLF is activated at a period of 7.8 μs, for example.

A circuit block related to the wafer-level burn-in test circuit 40 is explained next.

As shown in FIG. 2, the wafer-level burn-in test circuit 40 includes a wafer-level burn-in-test control circuit 40a and a wafer-level burn-in test-mode output circuit 40b. In FIG. 2, the wafer-level burn-in-test control circuit 40a is represented as "WLBI control circuit" and the wafer-level burn-in test-mode output circuit 40b is represented as "WLBI mode output circuit".

The wafer-level burn-in-test control circuit 40a sets a test mode of a wafer-level burn-in test and controls the power supply circuit 30 and the like according to the set test mode. Turing to FIG. 4, the test mode is set by setting the bank address BA2 to a low level and clocking the bank address BA1 while the wafer-level burn-in test signal WLBI is activated at a high level. A toggle circuit (not shown) is incorporated in the wafer-level burn-in-test control circuit 40a. By the toggle circuit counting the clocking number of the bank address BA1, it is possible to enter into an arbitrary test mode. The currently entered test mode is output from the wafer-level burn-in-test control circuit 40a as a mode signal WLBIDT0.

When setting of the test mode is completed, the bank address BA2 is changed to a high level while the wafer-level burn-in test signal WLBI remains activated at a high level. In this state, the external potential VDD supplied to the power supply terminal 31 is set to be higher than a potential during a normal operation and a stress is applied. In order to prevent generation of a leakage current, levels of other external signals that are supposed to be at a high level are also increased in conjunction with the external potential VDD. When both of the wafer-level burn-in test signal WLBI and the bank address BA2 become a high level, a test-mode output signal WLBIOUT that is an output of an AND gate circuit G2 is activated to a high level. The test-mode output signal WLBIOUT is supplied to the wafer-level burn-in test-mode output circuit 40b.

Figure 4:
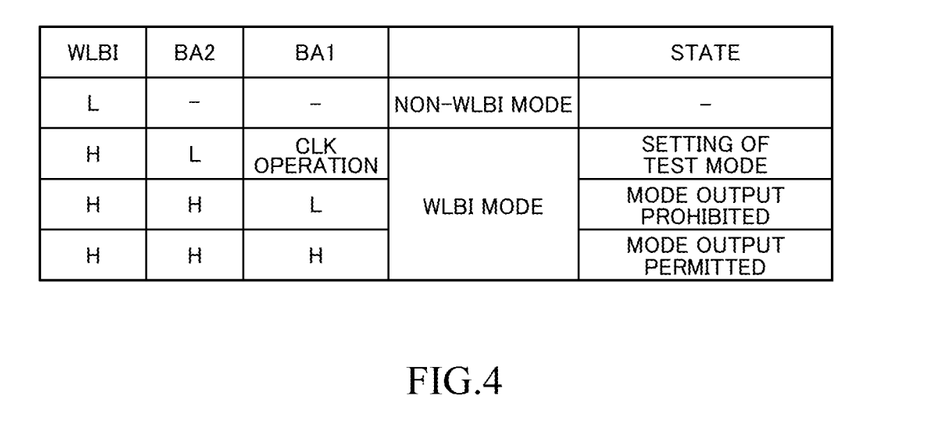
FIG. 4 is a table indicative of an embodiment of operation specified by combination of a wafer-level burn-in test signal WLBI and bank addresses BA1 and BA2.

At this time, a time period during which the bank address BA1 is set to a low level is a time period during which a load is actually applied. For example, in this time period, the potential of the word line WL is higher than a potential at a normal time. In this time period, as shown in FIG. 4, the output of a mode signal WLBIDT from the wafer-level burn-in test-mode output circuit 40b is prohibited and the mode signal WLBIDT is fixed to a low level. Meanwhile, in a time period during which the bank address BA1 is set to a high level, the output of the mode signal WLBIDT from the wafer-level burn-in test-mode output circuit 40b is permitted and the value of the mode signal WLBIDT is a value according to the currently set test mode.

Turning to FIG. 2, the test-mode output signal WLBIOUT is also supplied to a selector 52. The selector 52 selects the internal read data DATA when the test-mode output signal WLBIOUT is at a low level and selects the mode signal WLBIDT when the test-mode output signal WLBIOUT is at a high level. A selected signal is supplied to one input node of an AND gate circuit G3 and the output signal of the AND gate circuit G3 is supplied to the data output circuit 15a. Because an enable signal DATAEN is supplied to the other input node of the AND gate circuit G3, when the enable signal DATAEN is activated to a high level, a signal selected by the selector 52 is output from the data terminal 27. Because the wafer-level burn-in test signal WLBI is fixed to a low level during a normal operation, the selector 52 always selects the internal read data DATA.

The enable signal DATAEN is an output of an OR gate circuit G4. A read signal READ and the test-mode output signal WLBIOUT are input to the OR gate circuit G4. Accordingly, during a normal operation, the internal read data DATA is supplied to the data output circuit 15a in response to activation of the read signal READ. Meanwhile, during a wafer-level burn-in test, the AND gate circuit G3 is in a state of being capable of always outputting the mode signal WLBIDT in a time period during which the bank address BA2 is at a high level. The read signal READ is a signal activated in a time period during which the read data DQ is output during a reading operation. The read signal READ is also supplied to an OR gate circuit G5.

With the configuration explained above, when the bank address BA1=H and the bank address BA2=H during a wafer-level burn-in test, the mode signal WLBIDT output from the wafer-level burn-in test-mode output circuit 40b is externally output from the data terminal 27 and thus the type of the currently entered test mode can be recognized. During the wafer-level burn-in test, the logic of the internal clock signal LCLKDQ supplied to the data output circuit 15a is fixed; however, one of the clocked inverters 15R and 15F is activated by the circuit configuration shown in FIG. 3. Therefore, when the mode signal WLBIDT is supplied to both of the internal read data DATAR and DATAF, the mode signal WLBIDT is properly output from the data terminal 27.

Meanwhile, because a time period during which the bank address BA1=L and the bank address BA2=H is a time period during which the mode signal WLBIDT is not output during a wafer-level burn-in test, the logic of the internal clock signal LCLKDQ does not need to be fixed. According to the present embodiment, a dummy clock signal is supplied to the clock tree line 25 in this time period, so that NBTI degradation of the clock tree line 25 is prevented. A method of preventing NBTI degradation of the clock tree line 25 is specifically explained below.

As shown in FIG. 2, an inverted signal of the bank address BA1 and the test-mode output signal WLBIOUT are input to an AND gate circuit G6. Accordingly, when the bank address BA1=L and the bank address BA2=H during a wafer-level burn-in test, an activation signal WBICK that is an output of the AND gate circuit G6 is activated to a high level. The activation signal WBICK is supplied to the oscillator 20a and the oscillator 20a starts an operation in response to the activation of the activation signal WBICK. The activation signal WBICK is also supplied to the selector 51 and the OR gate circuit G5. When the activation signal WBICK is activated to a high level, the selector 51 selects the self-refresh timing signal SLF and supplies it to the selector 24b as the internal clock signal ICLKDLL. Because the selector 24b selects the internal clock signal ICLKDLL during the wafer-level burn-in test, the internal clock signal LCLK0 performs clocking in conjunction with the self-refresh timing signal SLF.

Furthermore, when the activation signal WBICK is activated, the read signal RD is always fixed to a high level by the OR gate circuit G5, and thus the internal clock signal LCLK also performs clocking and a dummy clock signal constituted by the self-refresh timing signal SLF is supplied to the clock tree line 25. Accordingly, NBTI degradation of the clock tree line 25 is prevented. Further, because the internal clock signal LCLK is also supplied to the replica line 24c, NBTI degradation of the replica line 24c is also prevented.

As described above, according to the present embodiment, because a dummy clock signal is supplied to the clock tree line 25 by using the oscillator 20a during a wafer-level burn-in test, NBTI degradation during the wafer-level burn-in test can be prevented without supplying the external clock signal CLK to the clock terminal 23. Consequently, changes in the duty of the internal clock signal LCLKDQ caused by NBTI degradation are prevented.

Furthermore, because the oscillator 20a is an inevitably provided circuit in any DRAM, a chip area of the DRAM hardly increases. Further, because an operation of the oscillator 20a is stopped in a time period during which the mode signal WLBIDT is externally output from the data terminal 27, there is no influence on an output operation of the mode signal WLBIDT. Therefore, it is also possible to use an existing test program as it is.

Figure 5:
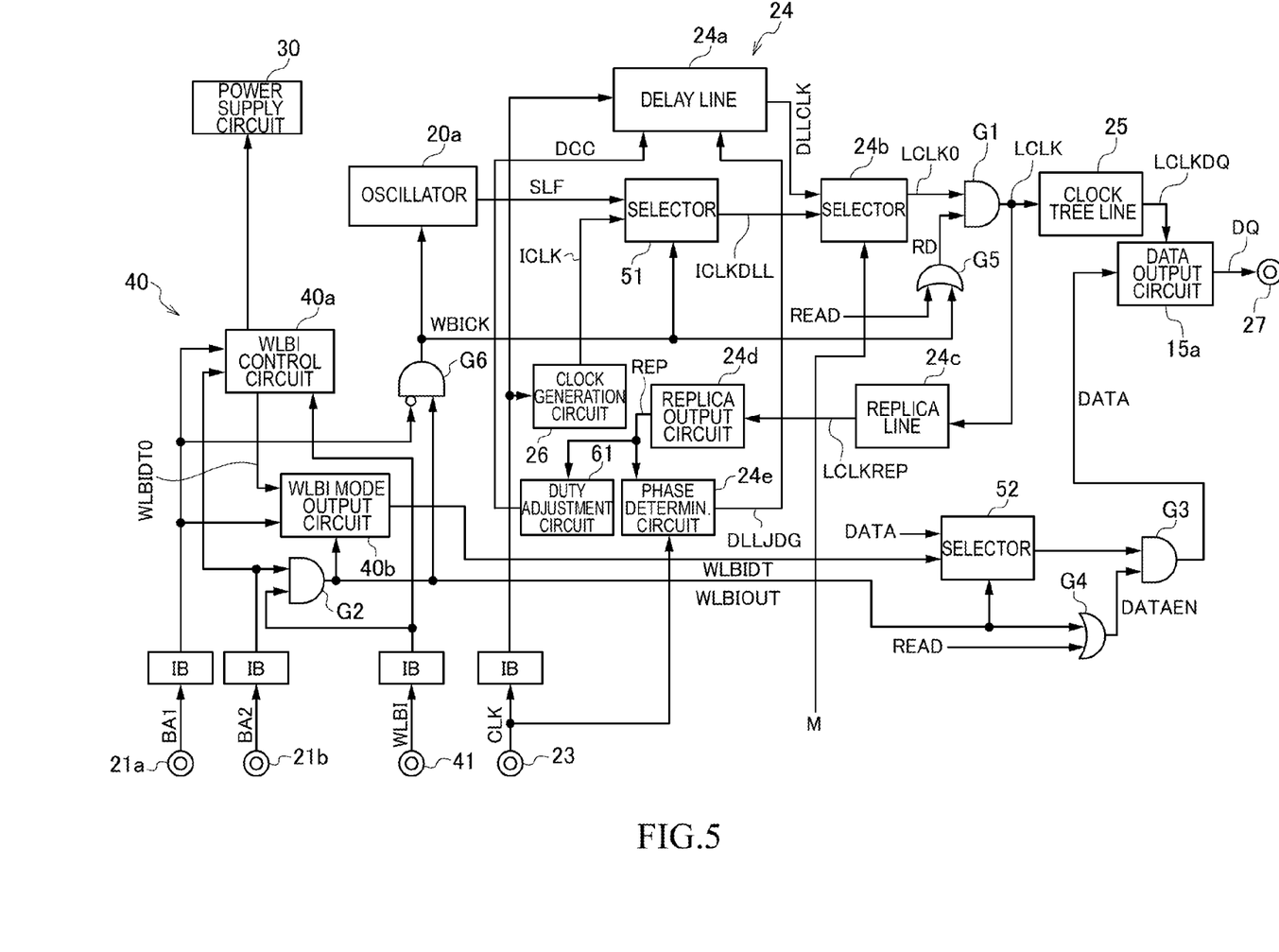
FIG. 5 is a block diagram indicative of an embodiment of a configuration of a main part of the semiconductor device 10 according to a modification.

A circuit shown in FIG. 5 is different from the circuit shown in FIG. 2 in that a duty adjustment circuit 61 is added. Other features of the circuit shown in FIG. 5 are identical to those of the circuit shown in FIG. 2, and thus like elements are denoted by like reference characters and redundant explanations thereof will be omitted.

The duty adjustment circuit 61 determines whether the duty of the replica signal REP is larger or smaller than 50% and outputs a result of the determination to the delay line 24a as a duty adjustment signal DCC. The delay line 24a changes the duty of the internal clock signal DLLCLK based on the duty adjustment signal DCC. Specifically, when the duty of the replica signal REP is larger than 50%, the delay line 24a reduces the duty of the internal clock signal DLLCLK based on the duty adjustment signal DCC. On the other hand, when the duty of the replica signal REP is smaller than 50%, the delay line 24a increases the duty of the internal clock signal DLLCLK based on the duty adjustment signal DCC. By repeating these operations, the duty of the internal clock signal DLLCLK is converged to 50%.

According to a circuit system shown in FIG. 5, the duty adjustment circuit 61 is arranged at a subsequent stage of the replica line 24c. Therefore, even when the duty of the internal clock signal LCLKDQ is shifted due to passing of the clock tree line 25, such shifting in the duty is reproduced also by the replica line 24c. With this configuration, the duty of the internal clock signal LCLKDQ can be properly corrected to 50%.

Figure 6:
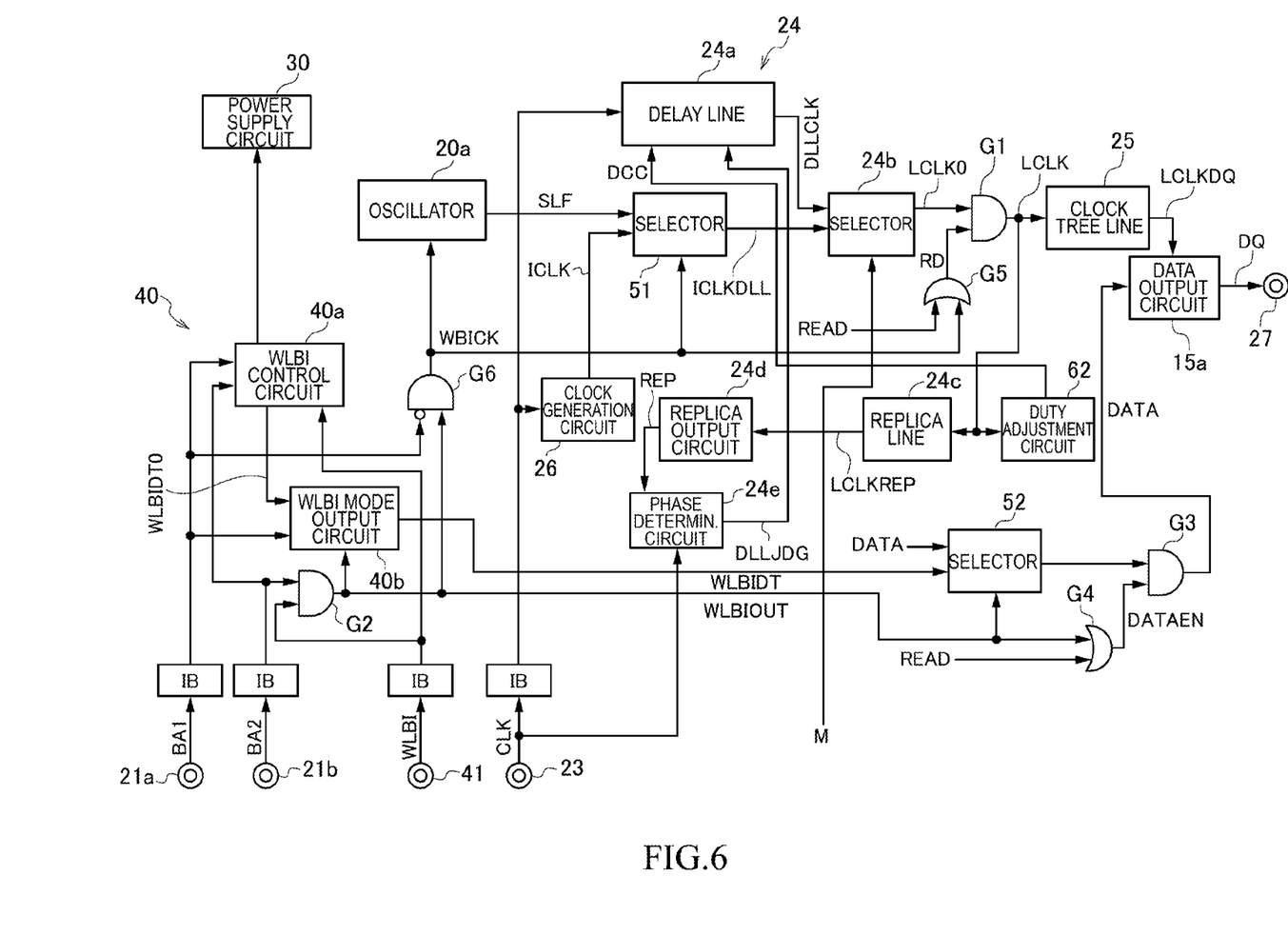
FIG. 6 is a block diagram indicative of an embodiment of a configuration of a main part of the semiconductor device 10 according to another modification.

A circuit shown in FIG. 6 is different from the circuit shown in FIG. 2 in that a duty adjustment circuit 62 is added. Other features of the circuit shown in FIG. 6 are identical to those of the circuit shown in FIG. 2, and thus like elements are denoted by like reference characters and redundant explanations thereof will be omitted.

The duty adjustment circuit 62 determines whether the duty of the internal clock signal LCLK is larger or smaller than 50% and outputs a result of the determination to the delay line 24a as the duty adjustment signal DCC. The delay line 24a changes the duty of the internal clock signal DLLCLK based on the duty adjustment signal DCC.

According to a circuit system shown in FIG. 6, the duty adjustment circuit 62 is arranged at a preceding stage of the replica line 24c. Accordingly, shifting in the duty of the internal clock signal LCLKDQ due to passing of the clock tree line 25 cannot be observed. However, according to the present embodiment, because NBTI degradation of the clock tree line 25 is suppressed, shifting in the duty of the internal clock signal LCLKDQ due to passing of the clock tree line 25 is considerably small. Therefore, the duty of the internal clock signal LCLKDQ can be corrected to about 50%. Furthermore, according to the circuit system shown in FIG. 6, the duty of the internal clock signal LCLKDQ before passing through the replica line 24c with a high load is observed, and therefore high jitter precision can be obtained and there is an advantage that variations between samples are also reduced.

Figure 7:
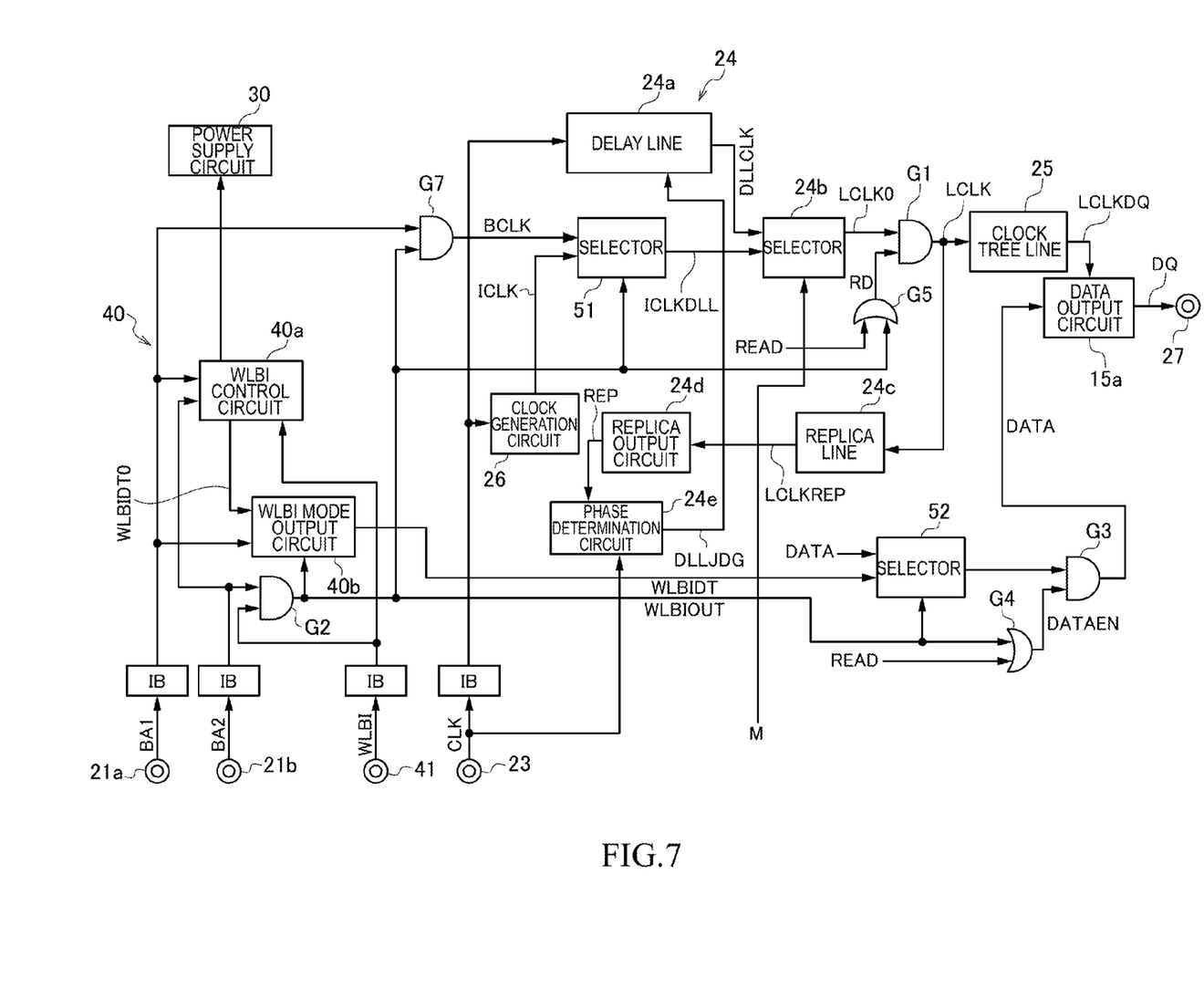
FIG. 7 is a block diagram indicative of an embodiment of a configuration of a main part of the semiconductor device 10 according to still another modification.

In a circuit shown in FIG. 7, an AND gate circuit G7 is provided instead of the oscillator 20a, and a dummy clock signal BCLK that is an output of the AND gate circuit G7 is supplied to the selector 51. Correspondingly, the test-mode output signal WLBIOUT is used instead of the activation signal WBICK. The AND gate circuit G7 takes a logical product of the bank address BA1 and the test-mode output signal WLBIOUT. Other features of the circuit shown in FIG. 7 are identical to those of the circuit shown in FIG. 2, and thus like elements are denoted by like reference characters and redundant explanations thereof will be omitted.

According to a circuit system shown in FIG. 7, during the wafer-level burn-in test, the logic of the clock tree line 25 in a time period during which a load is actually applied (BA1=L, BA2=H) is inverted from the logic in a time period during which the mode signal WLBIDT is output (BA1=H, BA2=H), and thus NBTI degradation of the clock tree line 25 can be prevented. Because a dummy clock signal is input from an address terminal in this modification, the semiconductor device 10 does not need to include the oscillator 20a.

It is apparent that the present invention is not limited to the above embodiments, but may be modified and changed without departing from the scope and spirit of the invention.

For example, in the above embodiment, while the phase-controlled internal clock signal LCLK is supplied to the clock tree line 25, whether the clock signal to be supplied to the clock tree line 25 is phase-controlled or not is not important. That is, using the delay line 24a as a clock generation circuit is not essential. This means that the semiconductor device according to the present invention is not limited to semiconductor devices including a DLL circuit.

What is claimed is:

1. A semiconductor device comprising:
a clock generation circuit that generates an internal clock signal during a normal operation, and stops generation of the internal clock signal during a wafer-level burn-in test;
a clock tree line that transmits the internal clock signal;
a selector that supplies a dummy clock signal, which is different from the internal clock signal, to the clock tree line during the wafer-level burn-in test; and
a plurality of address terminals to which an address signal is supplied from outside,
wherein the selector supplies the dummy clock signal to the clock tree line when the address signal indicates a first value, and stops supplying the dummy clock signal to the clock tree line when the address signal indicates a second value different from the first value.

2. The semiconductor device as claimed in claim 1, further comprising an oscillator that generates the dummy clock signal.

3. The semiconductor device as claimed in claim 2, further comprising:
a memory cell array that includes a plurality of memory cells;
an access control circuit that selects any one of the memory cells; and
a data output circuit that outputs read data read from a selected one of the memory cells in synchronization with the internal clock signal having passed through the clock tree line.

4. The semiconductor device as claimed in claim 3, wherein a periodic refresh operation on the memory cell array is automatically performed in response to an operation of the oscillator.

5. The semiconductor device as claimed in claim 1, further comprising an external terminal that receives the dummy clock signal from outside.

6. A semiconductor device comprising:
a clock terminal that receives an external clock signal from outside;
a delay line that generates an internal clock signal by delaying the external clock signal;
a clock tree line that transmits the internal clock signal;
a data output circuit that outputs data to outside in synchronization with the internal clock signal having passed through the clock tree line;
a selector that supplies a dummy clock signal to the clock tree line when the external clock signal is stopped;
a replica line that transmits the internal clock signal;
a replica output circuit that generates a replica signal in synchronization with the internal clock signal having passed through the replica line; and
a phase determination circuit that compares a phase of the replica signal to a phase of the external clock signal,
wherein the delay line is controlled based on a result of a determination by the phase determination circuit.

7. The semiconductor device as claimed in claim 6, further comprising a duty adjustment circuit that adjusts a duty cycle of the internal clock signal.

8. The semiconductor device as claimed in claim 7, wherein the duty adjustment circuit detects a duty cycle of the replica signal and adjusts the duty cycle of the internal clock signal based on a result of detection.

9. The semiconductor device as claimed in claim 7, wherein the duty adjustment circuit detects the duty cycle of the internal clock signal before passing through the replica line and adjusts the duty cycle of the internal clock signal based on a result of detection.

10. The semiconductor device as claimed in claim 6, further comprising an oscillator that generates the dummy clock signal.

11. The semiconductor device as claimed in claim 6, further comprising an external terminal that receives the dummy clock signal.

12. The semiconductor device as claimed in claim 6, wherein the selector supplies the dummy clock signal to the clock tree line when a test signal supplied from outside is activated.

13. The semiconductor device as claimed in claim 12, further comprising a plurality of address terminals to which an address signal is supplied from outside,
wherein the selector supplies the dummy clock signal to the clock tree line when the address signal indicates a first value, and stops supplying the dummy clock signal to the clock tree line when the address signal indicates a second value different from the first value.

14. The semiconductor device as claimed in claim 13, further comprising a wafer-level burn-in-test control circuit that is activated in response to the test signal,
wherein the wafer-level burn-in-test control circuit changes a type of test mode when the address signal indicates a third value different from the first and second values.

15. A manufacturing method of a semiconductor device, the method comprising:
preparing a semiconductor wafer having a plurality of semiconductor devices each including a clock tree line formed thereon, a replica line that transmits an internal clock signal, a replica output circuit that generates a replica signal in synchronization with the internal clock signal having passed through the replica line, and a phase determination circuit that compares a phase of the replica signal to a phase of an external clock signal;
performing a burn-in test on the semiconductor devices in a wafer state;
supplying a dummy clock signal to the clock tree lines during the burn-in test; and
controlling the delay line based on a result of a determination by the phase determination circuit.

16. The manufacturing method of a semiconductor device as claimed in claim 15, wherein the supplying is performed by activating an oscillator provided in each of the semiconductor devices.

17. The manufacturing method of a semiconductor device as claimed in claim 16, wherein the supplying is performed by activating the oscillator during which a load is applied to the semiconductor devices in the burn-in test.

18. The manufacturing method of a semiconductor device as claimed in claim 17, wherein the oscillator is deactivated during which a signal is output from the semiconductor devices in the burn-in test.

19. The manufacturing method of a semiconductor device as claimed in claim 15, wherein the dummy clock signal is supplied from an outside of the semiconductor devices.

\* \* \* \* \*